United States Patent

Grüning et al.

Patent Number: 5,210,451
Date of Patent: May 11, 1993

[54] POWER SEMICONDUCTOR CIRCUIT

[75] Inventors: Horst Grüning, Baden; Hervé de Lambilly, Nussbaumen; Ferdinand Steinruck, Mosen, all of Switzerland

[73] Assignee: Asea Brown Boveri Ltd., Baden, Switzerland

[21] Appl. No.: 717,091

[22] Filed: May 28, 1991

[30] Foreign Application Priority Data

Jun. 25, 1990 [CH] Switzerland ............... 2106/90-0

[51] Int. Cl.$^5$ .................. H03K 17/72; H03K 17/04
[52] U.S. Cl. .................................. 307/633; 307/491; 307/542; 307/570
[58] Field of Search ............. 307/633, 570, 542, 491

[56] References Cited

U.S. PATENT DOCUMENTS

| 4,231,083 | 10/1980 | Matsuda et al. | 307/633 |
| 4,609,831 | 9/1986 | Higashino et al. | 307/633 |
| 4,634,891 | 1/1987 | Yamagami | 307/633 |
| 4,785,208 | 11/1988 | Egger et al. | 307/633 |
| 4,876,635 | 10/1989 | Park et al. | |
| 4,929,856 | 5/1990 | Güning | 307/633 |

FOREIGN PATENT DOCUMENTS

| 0185181 | 6/1986 | European Pat. Off. |
| 0268260 | 5/1988 | European Pat. Off. |
| 0381849 | 8/1990 | European Pat. Off. |
| 3737906 | 5/1989 | Fed. Rep. of Germany |

OTHER PUBLICATIONS

Revue Generale de l'Electricite, No. 2, Feb. 1986, pp. 19-22, G. Mouries, "Evolution des Condensateurs de Puissance Secs".

Primary Examiner—John Zazworsky
Attorney, Agent, or Firm—Oblon, Spivak, McClelland, Maier & Neustadt

[57] ABSTRACT

A power semiconductor circuit comprises a gate-turn-off semiconductor component (FCTh1, FCTh2) having an anode, a cathode and a gate, a diode (D1, D2) and a drive circuit which is connected to the gate by a large-area, low-inductance stripline (11) and which generates a current pulse for turning off the semiconductor component. The diode (D1, D2) is arranged in series with the semiconductor component (FCTh1, FCTh2), specifically in such a way that the diode (D1, D2) and semiconductor component (FCTh1, FCTh2) form a quarter-bridge arm. Provided in parallel with the series circuit of the semiconductor component (FCTh1, FCTh2) and diode (D1, D2) is a low-inductance blocking capacitor (C1, C2) for absorbing the reverse recovery voltage peaks of the diode (D1, D2). The diode (D1, D2) and blocking capacitor (C1, C2) are arranged with low inductance and spatially immediately adjacent to the semiconductor component.

10 Claims, 5 Drawing Sheets

POWER SEMICONDUCTOR CIRCUIT

BACKGROUND OF THE INVENTION

1. Field of the Invention

The invention relates to a power semiconductor circuit comprising a gate-turn-off semiconductor component and a diode.

2. Discussion of Background

In order to be driven, the new, fast, gate-turn-off power semiconductor components, which are increasingly being applied in power electronics, such as, for example, the FCTh (Field Controlled Thyristor), the IGBT (Insulated Gate Bipolar Transistor), the MCT (MOS Controlled Thyristor) or the HF-GTO, require short current pulses having very high rates of current rise di/dt.

In order to be able to achieve such high di/dt values, total values of only a few nH or, possibly, of <1 nH are permissible for the inductance L of the drive circuit. An arrangement of the drive circuit outside the component case, and feeding the control pulses by coaxial cable, for example, are therefore no longer possible.

A solution to this problem emerges from the U.S. Pat. No. 5,027,192. It is a matter here of a fast power semiconductor circuit of the type mentioned at the beginning. The essential part of this older application concerns a flexible stripline as a low-inductance connection between the semiconductor component and drive circuit.

The recently developed latching, fine-structure, bipolar semiconductor components such as, for example, FCTh, FSGTO (Fine-Structure GTO) or SITh, exhibit greatly improved turn-off characteristics when driven very fast (rise time of the gate current <200 ns). They then permit fast processing of high currents and voltages ($dV_a/dt > 10$ kV/$\mu$s, $I \geq 100$ A, $U > 2$ kV). In this case, bulky and complicated snubber circuits, such as are presently unavoidable with GTOs, can be completely eliminated, as a rule. It is, however, a precondition that the reverse recovery of the free wheeling diodes cannot cause any excessive voltage peaks on parasitic inductances.

In the IGBTs restricted to low voltages (<1 kV), reverse recovery of the free wheeling diodes and commutation voltage peaks lead to problems if sizeable currents (>100 A) are to be switched. In order to avoid these, it is therefore necessary to use either snubbers, once again, or resistors in the input circuit to slow down the drive rate (see, for example, "Switching Performance of a new fast IGBT", L. Lorenz, G. Schulze, PCI—June 1988 Proceedings, pages 189-202). Similarly, fast fine-structure bipolar transistors (for example SIRET =SIEMENS Ring Emitter Transistor) also suffer from overvoltage peaks in the turn-off process. In practice, therefore, they are in no way capable of being applied with the full switching rate.

SUMMARY OF THE INVENTION

Accordingly, one object of this invention is to provide a novel, user-friendly power semiconductor circuit of the type mentioned at the beginning.

In particular, it is also an object of the invention to provide a low-inductance half-bridge module operating with at least one FCTh or one FSGTO, which can process high currents, is compact and can be used simply and in a modular fashion as far as the user is concerned.

According to the invention, the solution consists in that c) the diode is arranged in series with the semiconductor component in such a way that the diode and semiconductor component form a quarter-bridge arm, d) a low-inductance blocking capacitor is provided in parallel with the series circuit of semiconductor component and diode in order to absorb the reverse recovery voltage peaks, and f) the diode and blocking capacitor are arranged with low inductance and spatially immediately adjacent to the semiconductor component.

The essential point in the invention resides in the configuration of the output circuit. This configuration permits a user-friendly module to be constructed. Specifically, due to the low-inductance arrangement, voltage peaks are reduced to a minimum at the same time as there is a maximum drive rate. Short-circuit problems are avoided, since during switching inside the arrangement it is not possible for any undesired (fatal) capacitor discharging currents to flow via the semiconductor component. A possible short circuit can thus be detected from outside, so that turn-off can be effected without damage.

An important aspect of the invention is the splitting of the capacitance required when configuring the semiconductor component into an internal, not too large, low-inductance blocking capacitor and an external capacitor. The blocking capacitor, which because of its relatively modest size can be arranged very near the circuit-breaker and can thus be connected to the latter with low inductance, can absorb the strong voltage peaks optimally. It is important, in this case, that for the construction of, for example, a bridge circuits the three elements of circuit-breaker, diode and blocking capacitor are combined in the immediate spatial vicinity to form a quarter-bridge arm.

With regard to the desired low inductance, it is particularly advantageous for the realisation of the power semiconductor circuit according to the invention if the blocking capacitor is a low-inductance flat ceramic chip which is arranged on or near the diode, which is constructed as a flat semiconductor chip.

In order for the blocking capacitor to be kept as small as possible in simultaneous conjunction with good blocking action, it is expedient for the capacitance of the blocking capacitor to be dimensioned such that reverse recovery charging of the diode can lead only to a voltage variation delta $U_C$, which is no greater than 20% of a d.c. supply voltage $U_{DC}$.

The following design measures are to be provided in order to realise a handy and user-friendly electrical component:

a) the semiconductor component, diode, blocking capacitor and stripline are accommodated as a quarter-bridge arm in a module case, b) at least two wide, low-inductance metal lugs are provided as positive and negative lead, respectively, for feeding the d.c. supply voltage $U_{DC}$, and c) a load terminal leading outwards is connected between the diode and semiconductor component.

It is particularly advantageous a) to accommodate at least two quarter-bridge arms in a modular case as a half-bridge, it being the case that b) the semiconductor component is connected in one quarter-bridge arm as an HS arm with the anode to the positive lead and the diode between the cathode and the negative lead, and the semiconductor component is connected in the second arm as an LS arm with the cathode to the negative lead and the diode between the anode and positive lead, and that c) to reduce the rate of current rise in the case of arc-through, the load terminals of the quarterbridge arms are connected via an inductor.

In practice, bridge circuits are specifically associated with the widest applications of power semiconductor circuits.

It is advantageous for the inductor to be realised such that the load terminals of the two arms are led out separately from the module case, where, depending on the application, they are simply short-circuited or connected through a further choke.

To attenuate the voltage peaks, it is possible either for a separate clamping capacitor to be additionally provided between the positive and negative leads, or for the leads to be led out between the HS and LS arms, with low inductance, the leads outside the HS and LS arms being connected for the purpose of attenuating voltage peaks to a RC attenuating network.

If the semiconductor component, on the one hand, and the diode and blocking capacitor, on the other hand, are arranged immediately mutually adjacent on an insulating ceramic substrate, the cooling of the semiconductor component proves to be simple. Both the circuit breaker and diode can be cooled efficiently from the ceramic substrate. If all three (chip-shaped) components are stacked one upon another, it is possible to realise a particularly low inductance, but the diode or blocking capacitor are then unnecessarily heated by the unavoidable switching losses in the semiconductor component.

In order to prevent the voltage endurance, which the circuit breaker as such has, from being reduced in the installed state, the stripline has a portion soldered onto a main surface of the semiconductor component and is bent away from the main surface immediately outside the soldered-on portion in such a way that an electric field which builds up in the blocking state of the semiconductor component at the edge of the main surface is not disturbed.

The following specifications and dimensions have proved themselves in practice:

a) Use is made as the turn-off semiconductor component of a FCTh or a complementary FCTh, which is fixed to the ceramic substrate in the form of a direct Cu bonding;

b) the blocking capacitor has a capacitance of between 50 and 200 nF;

c) the additional clamping capacitor has a capacitance of between 1 and 5 $\mu f$;

d) the drive circuit comprises at least one MOSFET and at least one storage capacitor, which are soldered directly onto the stripline; and e) the stripline is flexible.

The turn-off semiconductor component can also be a IGBT. According to the invention, the latter is driven at the maximum rate. Thus, even in the case of high currents, it is no longer necessary to use gate resistors or snubber configurations in order to ensure operational reliability. As already mentioned, not every IGBT is current limiting (particularly not in the case of high currents).

Further advantageous embodiments follow from the totality of the dependent patent claims.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying

DESCRIPTION OF THE PREFERRED EMBODIMENTS

Figure 1A:
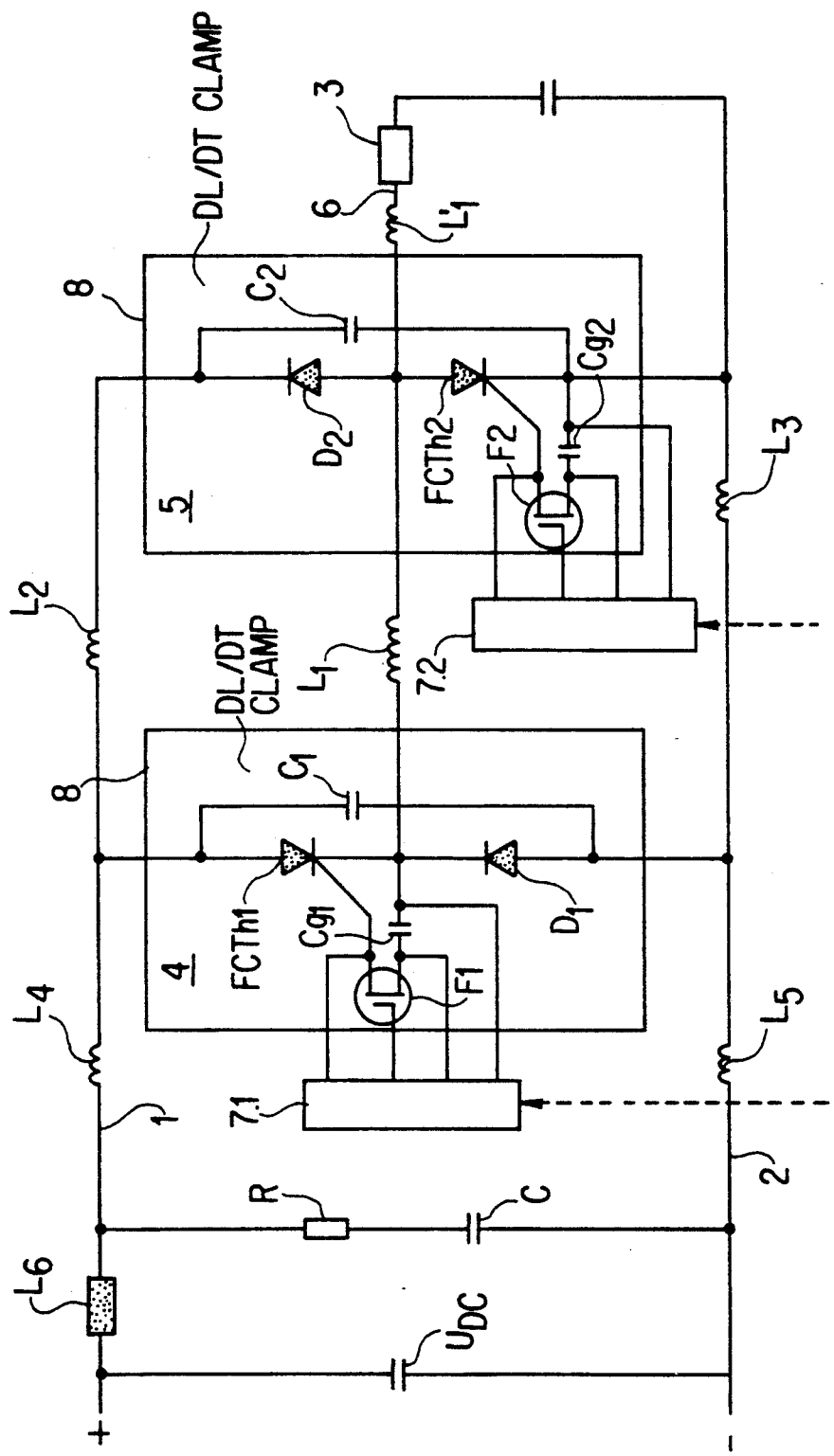
FIGS. 1a and 1b show a circuit arrangement for a half-bridge module.
Figure 1B:
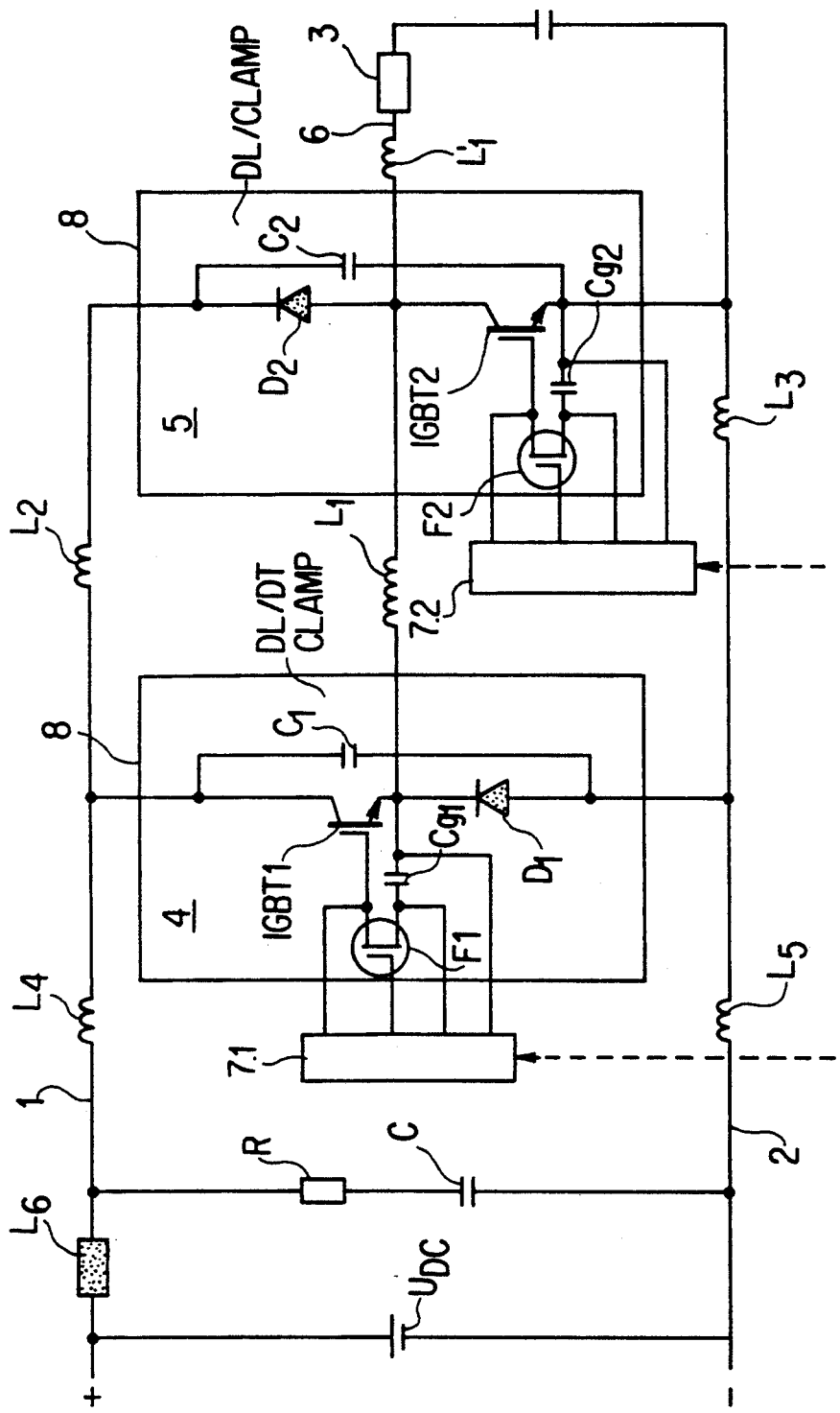

Referring now to the drawings, wherein like reference numerals designate identical or corresponding parts throughout the several views, FIGS. 1a and 1b show a circuit arrangement for a half-bridge module. A positive lead 1 and a negative lead 2 provide a d.c. supply voltage $U_{DC}$, the aim being to use a half-bridge module to convert the d.c. supply voltage into an alternating voltage for supplying a load 3.

The half-bridge is composed of two quarter-bridge arms, specifically an HS arm 4 (High Side) and an LS arm 5 (Low Side). In FIG. 1a, the two quarter-bridge arms each essentially comprise a turn-off semiconductor component FCTh1 or FCTh2, respectively, having an anode, a cathode and a gate, a diode D1 or D2, respectively, and a blocking capacitor C1 or C2, respectively. In FIG. 1b, the turn-off semiconductor components are implemented by means of IGBT's, i.e., IGBT1 and IGBT2. In both FIGS. 1a and 1b, located between the cathode and gate in each case is a drive circuit, with which the semiconductor components FCTh1, FCTh2 can be turned on and off.

The HS arm 4 is constructed as follows in terms of circuit technology. The semiconductor component FCTh1 and diode D1 are connected in series between the positive and negative leads 1 and 2. The semiconductor component FCTh1 is thus connected with its anode to the positive lead and with its cathode to a load terminal 6 leading outwards. The diode D1 is hooked up with its anode to the negative lead 2 and with its cathode likewise to the said load terminal 6. In accordance with the invention, the blocking capacitor C1 is arranged in parallel with the series circuit of the semiconductor component FCTh1 and diode D1.

The LS arm 5 is constructed similarly. The essential difference from the HS arm 4 resides in the interchanged position of the semiconductor component FCTh2 and diode D2. The two elements are thus each connected with their anode to the load terminal 6. Furthermore, the turn-off semiconductor component FCTh2 is hooked up with its cathode to the negative lead 2.

The drive circuits are embodied in a manner known per se. They each comprise a gate unit 7.1, 7.2, one or more MOSFETs F1, F2 connected in parallel, and for each MOSFET F1, F2 a capacitor Cg1, Cg2 for the gate current.

The small blocking capacitors C1, C2, which have an extremely low self-inductance for the purpose of absorbing the reverse recovery voltage peaks of the corresponding diode D1, D2, are the core of the invention. They are preferably constructed as ceramic chips and arranged, together with the respective diode D1, D2, spatially immediately adjacent to the semiconductor component. The inductance occurring in this circuit should be much smaller than 100 nH, preferably $\leq 10$ nH.

It is preferable for the blocking capacitors C1, C2 to be designed in terms of capacitance such that a reverse recovery charging of the associated diode D1, D2 can lead only to a voltage variation delta $U_C \leq 0.2\ U_{DC}$ (20% of the d.c. supply voltage). In practice, capacitance values of between 50 and 200 nF have proved themselves.

An important aspect relating to the half-bridge circuit according to the invention is the inductor designated by L1, which is provided in the load terminal 6 between the semiconductor component FCTh1 of the HS arm 4 and that (FCTh2) of the LS arm. Its function is to limit the rate of current rise in the case of inadvertent arc-through (both semiconductor components conducting) or a load short circuit.

If, in accordance with a preferred embodiment, the HS and LS arms 4 and 5, respectively, are accommodated as a half-bridge module in a single module case 8, the required inductance L1 can possibly be already realised such that the load terminals of the two arms are led out separately from the module case where they are simply short circuited in the application.

The positive and negative leads 1 and 2 are to have as low an inductance as possible (cf. inductors L2, L3, L4, L5) between the HS and LS arm 4 or 5, respectively, so that the two groups of components are loaded equally in the case of voltage or current surges. Commutation voltage peaks that are caused by L6 can be effectively attenuated by an RC attenuating network ($R \geq 0$).

L6 symbolises the leakage inductances present on the supply side. Attenuation means can be connected in addition in order to reduce the interference effects. In accordance with a first proposal, a larger separate clamping capacitor C is provided in addition between the positive and negative leads 1 and 2. The capacitance of this capacitor is preferably 1-5 $\mu F$. Instead of the clamping capacitor, it is also possible to install attenuating inductors L4, L5 in the supply voltage terminals (positive and negative leads). The dimensioning of these attenuation means is determined in a known way depending on the leakage inductance L6.

A further important aspect of the invention consists in driving the semiconductor component via a low-inductance stripline with a low-inductance circuit. The use of such a stripline is already the subject of the noted U.S. Pat. No. 5,027,192. The description of the known patent is thus to be understood as having been included in the present description. Consequently, in the following explanations the details of the low-inductance stripline and of the driving are not discussed anew.

Figure 2A:
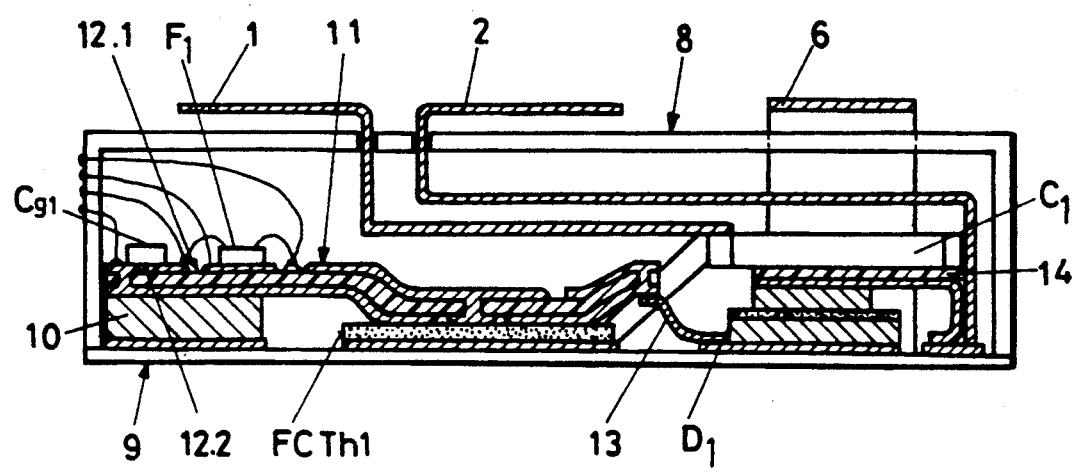
FIGS. 2a and 2b show a design embodiment of a HS module.
Figure 2B:
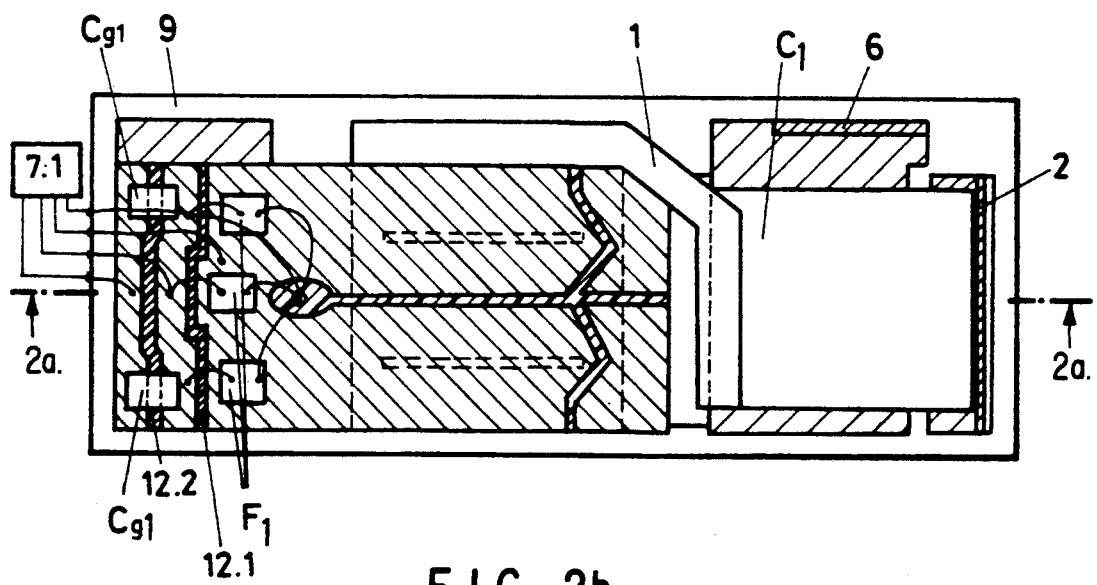

FIGS. 2a, 2b show a preferred design construction of a quarter-bridge module as a HS arm. The longitudinal section through this arrangement is shown in FIG. 2a, and the corresponding plan view is shown in FIG. 2b. The sections in accordance with FIG. 2a was taken along the line A—A.

Arranged in a module case 8 mutually adjacent on a ceramic substrate 9 are a turn-off semiconductor component FCTh1, preferably a Field-Controlled Thyristor (FCTh), a diode D1 and a blocking capacitor C1. The FCTh is soldered with its abnode, for example as a so-called direct copper bonding on the ceramic substrate (for example, $Al_2O_3$), so that good heat dissipation is enabled.

In accordance with a preferred embodiment of the invention, the blocking capacitor C1 is a low-inductance flat ceramic chip, arranged on the diode D1, which is constructed as a flat semiconductor chip. The two components stacked one upon another are soldered on one side of the semiconductor component FCTh1 onto the ceramic substrate. The diode D1 has its cathode directed towards the ceramic substrate 9. It is connected with its anode to the negative lead 2. An insulating layer 14 is inserted between the anode side of the diode D1 and the blocking capacitor C1 located above it (ceramic chip). A first contact on the edge of the ceramic chip is likewise connected to the negative lead 2.

A flexible, copper-clad stripline 11 provides the low-inductance connection to the drive circuit. It is soldered in a middle portion with its lower side onto the cathode side of the semiconductor component FCTh1. In this arrangement, it makes contact, on the one hand, with the cathode and, on the other, hand, with the gate of the semiconductor component FCTh1. For this purpose, its copper cladding is split by means of suitable etched trenches 12.1, 12.2 into mutually isolated contact regions (see U.S. Pat. No. 5,027,192).

A first free end of the stripline 11 is soldered onto a raised contact post 13, and a second end, located opposite, is soldered onto a copper block 10, which creates a raised support surface. The essential point in the lateral fixing, according to the invention, of the stripline 11 resides in that, because of its flexibility, the stripline 11 is formed such that its lower side is bent away from its main surface immediately outside the portion soldered onto the semiconductor component FCTh1. Consequently, the electric field, which builds up in the blocking state in the vicinity of the edges of the component, is essentially not disturbed.

The drive circuit comprises an external (shown in FIG.2b) gate unit 7.1 and (for example, two) capacitors Cg1 and (for example, three) MOSFETs F1. The last mentioned circuit elements are preferably arranged on the upper side of the end of the stripline 11 which is soldered onto the copper block 10 (as described in U.S. Pat. No. 5,027,192.

The positive and negative lead 1 and 2 are preferably constructed as wide, low-inductance metal lugs. The required low inductance is also achieved, in particular, by guiding the metal lugs over as large as possible a portion of length (inside the module case 8) parallel to one another at as small a separation as possible (the smaller the separation the less the inductance).

Moreover, a load terminal 6 is led out from the module case 8. If, in accordance with a preferred embodiment, both a HS and a LS arm are accommodated in a common module case, two load terminals can be provided. In order to realise the inductor L1 described above, the metal lugs of the load terminals can be formed such that, together with an externally applied short-circuit, they have precisely the required inductance.

Figure 3A:
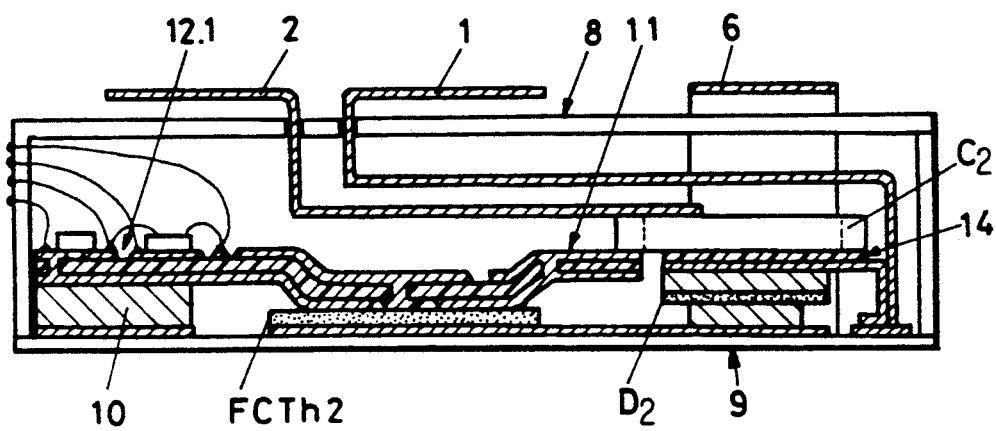
FIGS. 3a and 3b show a design embodiment of a LS module.
Figure 3B:
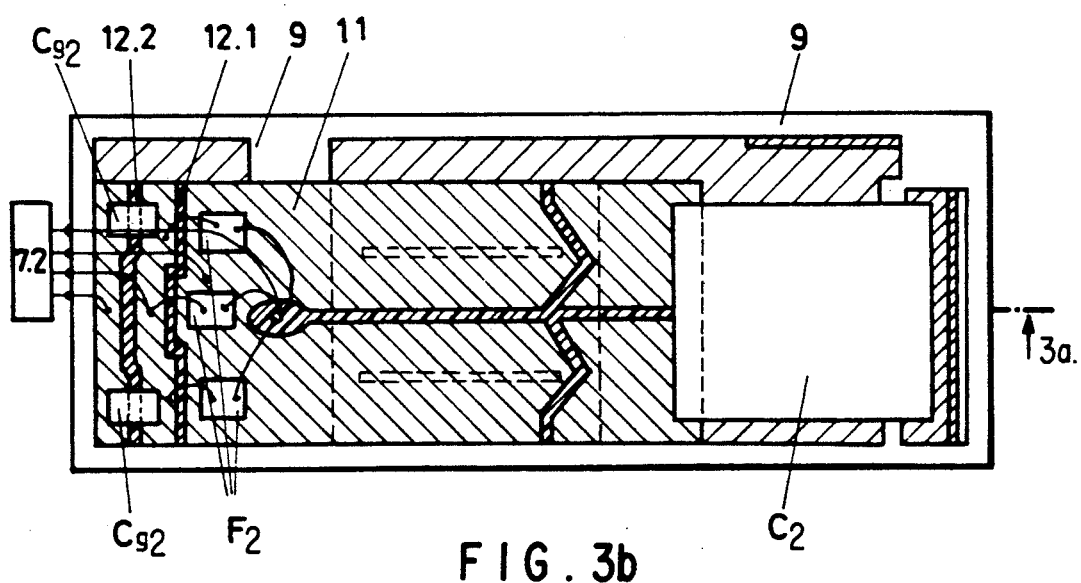

FIGS. 3a and 3b show an LS module. It has essentially the same features as the HS module just described. There is a difference in the polarity of the diode D2 and in the supply voltage terminals. In the present case, the diode D2 has its anode side turned towards the ceramic substrate 9. The stripline 11 is soldered directly onto the ceramic chip (blocking capacitor C1). Since the ceramic chip is stacked onto the diode D1, its contact terminals have precisely the required separation from the semiconductor component in order to attain the curvature according to the invention. The contact post 13 of FIG. 2 can thus be omitted.

Figure 4:
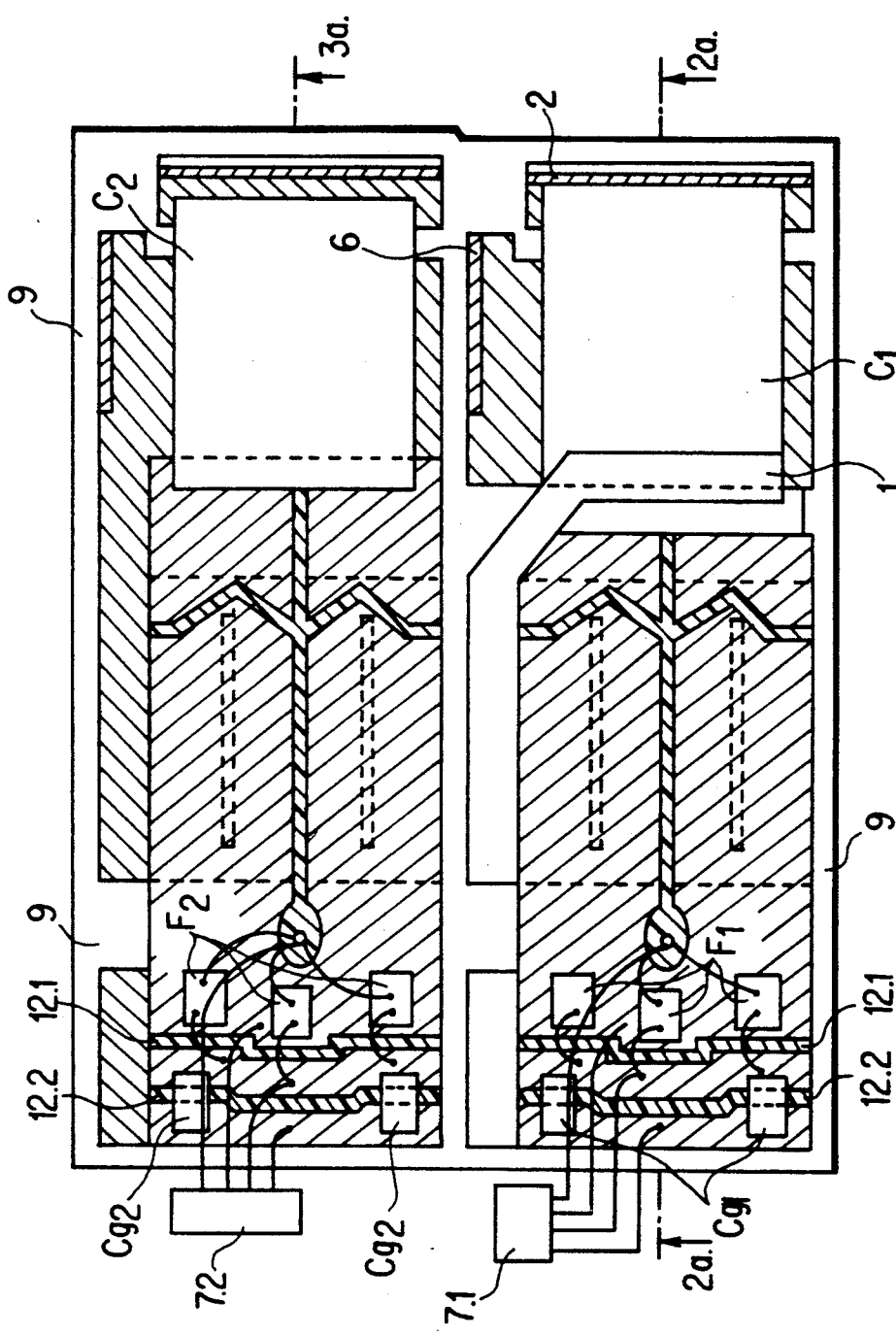
FIG. 4 shows a design embodiment in which two quarter-bridge arms as shown in FIGS. 2b and 3b are accommodated in a module case as a half-bridge.

FIG. 4 shows in plan view a construction of two quarter-bridge arms, as shown in FIGS. 2b and 3b, accommodated in a module case. Since the elements of FIG. 4 are described above in relation to FIGS. 2b and 3b, further description of FIG. 4 is omitted for brevity's sake.

It can be stated in summary that the invention specifies circuitry and design measures with which user-friendly modules for realising bridge circuits can be assembled.

Obviously, numerous modifications and variations of the present invention are possible in light of the above teachings. It is therefore to be understood that within the scope of the appended claims, the invention may be practised otherwise than as specifically described herein.

What is claims as new and desired to be secured by Letters Patent of the United States is:

1. A power semiconductor circuit adapted to be connected to a d.c. power supply voltage $U_{DC}$, comprising:
    a gate-turn-off semiconductor component including a gate-electrode, a cathode, and an anode, wherein the semiconductor component can be turned off by a current pulse at said gate-electrode;
    a diode having a cathode and an anode connected in a series circuit with the semiconductor component, wherein in the series circuit either the anode of the diode is connected to the anode of the semiconductor component or the cathode of the diode is connected to the cathode of the semiconductor component;
    the series circuit of the diode and the semiconductor component forming a quarter-bridge branch which is one half of a half-bridge, wherein the series circuit of the diode and the semiconductor component is connected via an inductor to the power supply voltage $U_{DC}$;
    a low inductance blocking capacitor connected in parallel with the series circuit of the semiconductor component and the diode in order to absorb voltage peaks caused by a reverse recovery of the diode; and
    the diode and the blocking capacitor arranged immediately next to the semiconductor component such that the connection between the blocking capacitor and the series circuit of the diode and the semiconductor component is low in inductance.

2. The power semiconductor circuit as claimed in claim 1, wherein the blocking capacitor is a low-inductance flat ceramic chip arranged on or immediately next to the diode, which is constructed as a flat semiconductor chip.

3. The power semiconductor circuit as claimed in claim 1, wherein the capacity of the blocking capacitor is such that a reverse current of a reverse recovery phase of the diode can lead only to a voltage variation delta $U_c$ which is not greater than 20% of the D.C. supply voltage $U_{DC}$.

4. The power semiconductor circuit as claimed in claim 1, comprising:
    the semiconductor component, the diode, and the blocking capacitor as the quarter-bridge branch being built in a module case;
    at least two wide, low-inductance metal lugs provided as positive and negative leads, respectively, for feeding the d.c. supply voltage $U_{DC}$;
    a load output terminal connected to a node between the diode and the semiconductor component of said quarter-bridge branch; and
    a drive circuit connected to the gate-electrode of the semiconductor component by a large-area, low-inductance stripline and generating said current pulse to turn off the semiconductor component.

5. The power semiconductor circuit as claimed in claim 4, comprising:
    at least first and second quarter-bridge branches are built in a module case as said half-bridge;
    the semiconductor component of the first quarter-bridge branch of the half-bridge connected with its anode to the positive lead, and the diode of the first quarter-bridge branch connected with its cathode to the cathode of the semiconductor component of the first quarter-bridge branch and with its anode to the negative lead; and
    the semiconductor component in the second quarter-bridge branch of the half-bridge connected with its cathode to the negative lead, and the diode of the second quarter-bridge branch connected with its anode to the anode of the semiconductor component and with its cathode to the positive lead; and
    to reduce an effect of arc-through, the load output terminals of the two quarter-bridge branches connected via an inductor.

6. The power semiconductor circuit as claimed in claim 5, comprising:
    a separate clamping capacitor provided between the positive and negative leads.

7. The power semiconductor circuit as claimed in claim 4, comprising:
    the blocking capacitor comprising a low-inductance flat ceramic chip, which is constructed as a flat semiconductor chip, and which is arranged on or immediately next to the diode,; and
    the semiconductor component, on the one hand, and the diode and the blocking capacitor, on the other hand, arranged immediately mutually adjacent on an insulating ceramic substrate.

8. The power semiconductor circuit as claimed in claim 7, wherein the stripline has a portion soldered onto a main surface of the semiconductor component, and the stripline is bent away from the main surface immediately outside the soldered-on portion such that an electric field, which builds up at the edge of the main surface in the blocking state of the semiconductor component, is not disturbed.

9. The power semiconductor circuit as claimed in claim 6, wherein:
    the turn-off semiconductor component is an FCTh or a complementary FCTh, which is fixed to the ceramic substrate by means of a direct Cu bonding;
    the blocking capacitor has a capacity of between 50 and 200 nF;
    the additional clamping capacitor has a capacity of between 1 and 5 $\mu$F;
    the drive circuit comprises at least one MOSFET and at least one storage capacitor, which are soldered directly onto the stripline; and
    the stripline is flexible.

10. The power semiconductor circuit as claimed in claim 1, wherein:
    the turn-off semiconductor component is an IGBT; and
    the drive-circuit drives the IGBT at a maximum di/dt-rate.

* * * * *